United States Patent [19]

Hosomi et al.

[11] Patent Number: 5,756,190
[45] Date of Patent: May 26, 1998

[54] UNDERCOATING AGENT FOR MULTILAYER PRINTED CIRCUIT BOARD

[75] Inventors: Takeshi Hosomi; Toyoaki Kishi; Tomoyoshi Honjoya; Sei Nakamichi; Masahiro Mitsui, all of Fujieda, Japan

[73] Assignee: Sumitomo Bakelite Company Limited, Tokyo, Japan

[21] Appl. No.: 734,874

[22] Filed: Oct. 22, 1996

[30] Foreign Application Priority Data

Oct. 31, 1995 [JP] Japan .................. 7-284225

[51] Int. Cl.$^6$ .................. B32B 3/00; B32B 7/12; G03C 5/00
[52] U.S. Cl. .................. 428/209; 428/345; 428/901; 430/18; 430/311; 430/319
[58] Field of Search .................. 428/209, 901, 428/345; 430/18, 311, 319

[56] References Cited

U.S. PATENT DOCUMENTS

| | | | |
|---|---|---|---|
| 4,311,753 | 1/1982 | Pucci | 428/901 |
| 4,372,800 | 2/1983 | Oizumi et al. | 428/901 |
| 4,410,612 | 10/1983 | Goff et al. | 428/901 |
| 4,477,512 | 10/1984 | Thomas et al. | 428/901 |
| 4,578,315 | 3/1986 | Santorelli | 428/414 |
| 5,075,155 | 12/1991 | Jellinek et al. | 428/901 |
| 5,160,783 | 11/1992 | Nemoto et al. | 428/413 |
| 5,234,970 | 8/1993 | Kyle | 428/901 |
| 5,346,743 | 9/1994 | Uchida et al. | 428/76 |
| 5,412,002 | 5/1995 | Enomoto et al. | 528/97 |

OTHER PUBLICATIONS

Japan Abstract, JP7245480, vol. 96, No. 1, Sep. 19, 1995.
Japan Abstract, JP7202418, vol. 95, No. 11, Aug. 4, 1995.
Japan Abstract, JP7170073, vol. 95, No. 10, Jul. 4, 1995.
Japan Abstract, JP8157566, vol. 96, No. 10, Jun. 18, 1996.
Japan Abstract, JP8111585, vol. 96, No. 8, Apr. 30, 1996.

*Primary Examiner*—Cathy F. Lam
*Attorney, Agent, or Firm*—Browdy and Neimark

[57] ABSTRACT

An undercoating agent for a multilayer printed circuit board which comprises:

(a) a normally solid epoxy resin having a softening point of 45° to 120° C., (b) an epoxy resin curing agent, (c) a diluent in which the epoxy resin is dissolved and which consists of a photopolymerizable monomer, and (d) a photopolymerization initiator, said undercoating agent being effectively used in the production of a multilayer printed circuit board which utilizes making the undercoating agent tack-free by irradiation with active energy beams and the main curing of the undercoating agent by heating.

13 Claims, 1 Drawing Sheet

UNDERCOATING AGENT FOR MULTILAYER PRINTED CIRCUIT BOARD

BACKGROUND OF THE INVENTION

1. Field of the Invention

This invention relates to a light and heat curable undercoating agent for a multilayer printed circuit board which utilizes making the undercoating agent tack-free by irradiation with a light (active energy beam) such as ultraviolet ray or the like and the main curing of the undercoating agent by heat.

2. Description of the Related Art

As to a multilayer printed circuit board, miniaturization and multifunctionalization have proceeded in electronic devices and the technique is shifted in the direction of making the density higher. That is to say, the technique is proceeding in the direction of making the circuit pattern finer, allowing a printed circuit board to have much more layers, making the diameter of via hole smaller and thinning the board or the like.

In the production of a multilayer printed circuit board, there has been used a process which comprises putting at least one sheet of a prepreg obtained by impregnating a glass cloth substrate with an epoxy resin and semi-curing the resin, on an internal layer circuit board on which a circuit has been formed, further putting a copper foil on the prepreg sheet and then molding the resulting assembly under heating by a hot plate press. However in this process, the resin in the prepreg is allowed to flow again by heat and cured under a given pressure, and hence a period of 1 to 1.5 hours is required for uniformly curing and molding the prepreg. Since the production process requires such a long period of time and in addition a hot plate press and a glass cloth prepreg are necessary, the production cost becomes high. Moreover, since a method of impregnating a glass cloth with a resin is carried out, it has been difficult to make the thickness between circuit layers smaller.

In recent years, for solving the above problems, attention has been paid again to a technique of preparing a multilayer printed circuit board by a build-up system in which neither the heat-pressure molding by a hot plate press nor the glass cloth as an insulator between circuit layers are used.

In the production of a multilayer printed circuit board by a build-up system, when as an insulator between circuit layers the prepreg sheet obtained by impregnating a glass cloth with an epoxy resin and semi-curing the same is replaced with a copper-clad insulating sheet wherein an insulating resin layer is formed on the roughened surface of the copper foil, or with an insulating resin in the form of a film, the working efficiency is remarkably increased as compared with a method of forming an insulating layer between the circuit layers using a prepreg. However, it is impossible to completely remove air present in the difference in level between insulating substrate and circuit in the internal layer circuit board, and hence, bubbles remain and cause bad insulation and deterioration of solder heat resistance, and furthermore, delamination is caused in some cases, which has become a problem. For preventing the problem, the lamination must be carried out under reduced pressure, and hence, a special equipment is required. Moreover, since the laminated insulating layer follows the difference in level between insulating substrate and circuit in the internal layer circuit board, there are such problems that no surface smoothness is obtained, soldering failure is caused when a completed part is mounted, the peeling-off of a resist is caused in the course of forming an etching resist, a reduction of pattern-developing degree is caused, the stabilized resist formation is impossible, and the like.

Moreover, similarly to the case of using a prepreg, the amount of a resin filled is varied depending upon the percentage of the remaining copper foil of a circuit pattern in the internal layer circuit board, so that even when a copper-clad insulating sheet or a film-like insulating resin is used, the thickness of the multilayer printed circuit board after molding does not become the same. That is to say, when the percentage of the remaining copper foil is large and the portions to be filled with the resin are a little, the board thickness becomes large, and when the percentage of the remaining copper foil is small and the portions to be filled with the resin are much, the board thickness becomes small, and hence, it is not possible to achieve the same board thickness unless the thickness of an insulating sheet or film is varied depending upon the percentage of the remaining copper foil. Furthermore, even in the case of a single internal layer circuit board, there is such a disadvantage that the thickness of a multilayer printed circuit board obtained does not become uniform when the percentage of the remaining copper foil varies with positions, and this has been a problem to be solved.

After that, in the production of a multilayer printed circuit board by a build-up system, when a film-like insulating resin layer is used, the coating of an undercoating agent on the internal layer circuit board has been generalized for diminishing the difference in level between insulating substrate and circuit in the internal layer circuit board and making its surface smoother. As a typical example thereof, there has been subjected to various studies a method which comprises laminating a copper foil coated with an insulating adhesive to an internal layer circuit board coated with an undercoating agent which has not been cured or has been semi-cured or cured, and curing the laminate to obtain a multilayer printed circuit board. By such a method, the difference in level between insulating substrate and circuit in an internal layer circuit board is diminished, and hence, there are obtained such merits that the lamination of a copper foil coated with an insulating adhesive is facilitated and the necessity to consider the percentage of the copper foil residue in the internal layer circuit board becomes a little.

SUMMARY OF THE INVENTION

An object of this invention is to provide an undercoating agent for obtaining a multilayer printed circuit board which is thin in thickness, small in variation of thickness, smooth in surface and hence suitable for high density packaging.

Other objects and advantages of this invention will become apparent from the following description.

According to this invention, there is provided an undercoating agent for a multilayer printed circuit board which comprises:

(a) a normally solid epoxy resin having a softening point of 45° to 120° C., (b) an epoxy resin curing agent, (c) a diluent in which the epoxy resin is dissolved and which consists of a photopolymerizable monomer, and (d) a photopolymerization initiator;

preferably an undercoating agent for a multilayer printed circuit board wherein the above epoxy resin curing agent (b) is a high temperature-curable imidazole compound having a melting point of not less than 130° C., and the photopolymerizable monomer (c) is at least one compound selected from the group consisting of glycidyl acrylate, glycidyl methacrylate, hydroxyethyl acrylate and hydroxyethyl methacrylate; and more preferably, an undercoating agent for a multilayer printed circuit board wherein the normally solid epoxy resin having a softening point of 45° to 120° C. (a) is a mixture of:

(A) a brominated novolak type epoxy resin having a bromination degree of not less than 20% and a molecular weight of 500 to 4,000, (B) a bisphenol type epoxy resin having a molecular weight of 500 to 2,000, and (C) a bisphenol type liquid epoxy resin having a molecular weight of not more than 500;

the epoxy resin curing agent (b) is a mixture of:

(D) a high temperature-curable imidazole compound having a melting point of not less than 130° C. and (E) a low temperature-curable imidazole compound; and the diluent (c) in which the epoxy resin is dissolved and which consists of a photopolymerizable monomer is a mixture of:

(F) glycidyl acrylate or glycidyl methacrylate and (G) hydroxyethyl acrylate, hydroxyethyl methacrylate or triethylene glycol dimethacrylate.

BRIEF DESCRIPTION OF THE DRAWING

FIG. 1(A) to FIG. 1(C) are schematic sectional views explaining the process of preparing a multilayer printed circuit board (an example) using the undercoating agent of this invention. In FIG. 1(A) to FIG. 1(C), 1 refers to an internal layer circuit board, 2 to an internal layer circuit, 3 to an undercoating agent, 4 to a thermosetting type insulating adhesive, 5 to a copper foil, 6 to a rigid roll and 7 to a multilayer printed circuit board.

DETAILED DESCRIPTION OF THE INVENTION

Figure 1:
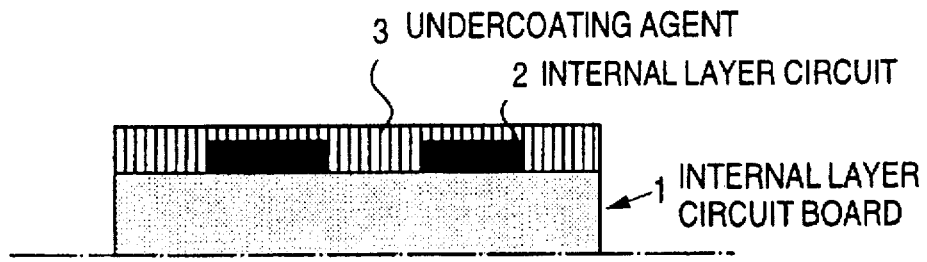
Figure 1:
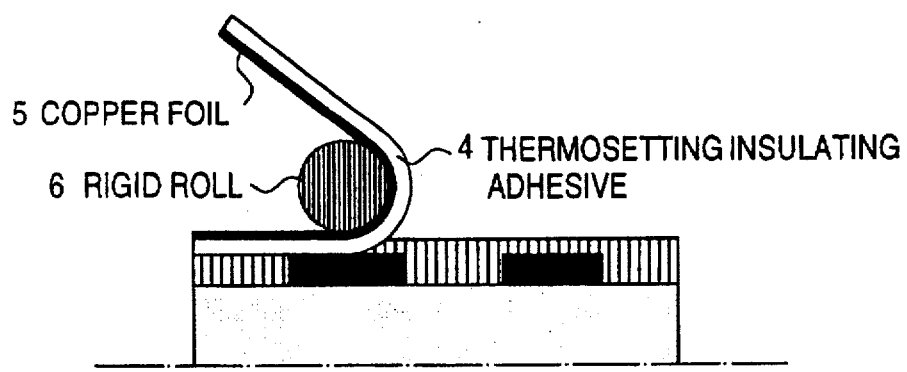
Figure 1:
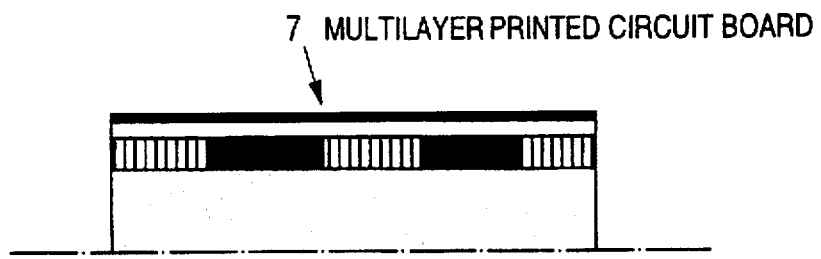

The undercoating agent of this invention is coated on an internal layer circuit board in the liquid state by means of a screen printing, a roller coater, a curtain coater or the like, to fill the concaves between the copper foil circuits of the internal layer circuit board therewith, and then irradiated with a light (active energy beams) such as ultraviolet rays or the like through an exposing machine or the like to polymerize the photopolymerizable monomer, thereby making the undercoating agent tack-free. Subsequently, a copper foil provided with an uncured or semi-cured insulating adhesive is laminated by means of a heated roll or the like to the internal layer circuit board coated with the undercoating agent. After the lamination, the resulting assembly is heated to subject both the light and heat-curable undercoating agent and the copper foil provided with an insulating adhesive to integral curing reaction, whereby a multilayer printed circuit board can be prepared. In the lamination, the undercoating agent is heated by a roll or the like to be softened and the thickness thereof is averaged by a roll pressure, so that the surface of the copper foil can be smoothened.

The component (a) used in this invention is a normally solid epoxy resin having a softening point of 45° to 120° C., preferably consisting of the component (A), or a mixture of the components (A), (B) and (C).

The brominated novolak type epoxy resin having a bromination degree of not less than 20% and a molecular weight of 500 to 4,000 [the component (A)] is used for enhancing the heat resistance and flame retardancy, and is a normally solid one of the phenol novolak type or cresol novolak type.

The softening point of the component (A), when used together with the components (B) and (C), may be within the range of 50° C. to 150° C. When the bromination degree is less than 20%, the multilayer printed circuit board obtained hardly achieve V-0 of the non-flammability UL Standards in many cases. In this connection, the upper limit of the bromination degree corresponds to the case where all the brominatable positions of the benzene nuclei of the epoxy resin have been brominated, whereby the upper limit of bromination is determined.

The component (B) is a bisphenol type epoxy resin having a molecular weight of 500 to 2,000 and is used mainly for enhancing the flexibility and adhesiveness between the internal layer circuit board and the insulating adhesive, and the interaction with the component (A) and the component (C) affects the heat resistance, voidlessness and surface smoothness. When the molecular weight exceeds 2,000, the viscosity of the undercoating agent increases, the fluidity and ability to fill the concaves between internal layer circuits are deteriorated and the surface smoothness becomes bad, and hence, such a molecular weight is not desirable.

The component (C) is a bisphenol type liquid epoxy resin having a molecular weight of not more than 500 and is blended particularly for enhancing the ability to fill the concaves between internal layer circuits, the wettability to the internal layer circuit board, voidlessness and surface smoothness. When the molecular weight exceeds 500, these effects are diminished, and hence, such a molecular weight is not desirable.

The epoxy resin curing agent (b) may be any of the various curing agents which are generally used, and include, for example, aromatic diamines such as 4,4'-diaminodiphenylmethane, 4,4'-diaminodiphenylsulfone, m-phenylenediamine, p-phenylenediamine and the like; aliphatic polyamines such as diethylenetriamine, triethylenetetramine, tetraethylenepentamine, hexamethylenetriamine, menthenediamine, isophoronediamine and the like; acid anhydrides such as phthalic anhydride, tetrahydrophthalic anhydride, methyltetrahydrophthalic anhydride, methylendomethylenetetrahydrophthalic anhydride, methylbutenyltetrahydrophthalic anhydride, hexahydrophthalic anhydride, methylhexahydrophthalic anhydride, trimellitic anhydride, pyromellitic anhydride, benzophenonetetracarboxylic anhydride and the like; etc. The amount of the epoxy resin curing agent is varied depending upon the kind of the curing agent and is usually 0.1 to 1.0 equivalent to glycidyl group.

Other epoxy resin curing agents include imidazoles such as imidazole, 2-methylimidazole, 2-ethyl-4-methylimidazole, 2-phenylimidazole, 1-benzyl-2-methylimidazole, 2-undecylimidazole, 2-phenyl-4-methylimidazole, bis(2-ethyl-4-methylimidazole), 2-phenyl-4-methyl-5-hydroxymethylimidazole, 2-phenyl-4, 5-dihydroxymethylimidazole, triazine-addition type imidazole and the like; amine complexes of boron trifluoride; dicyandiamide; derivatives of dicyandiamide; and the like. The amount of said other epoxy resin curing agent is varied depending upon the kind of the curing agent, and is usually 0.1 to 100 parts by weight per 100 parts by weight of the epoxy resin. Moreover, epoxy adducts of them and microcapsules of them can also be used.

In this invention, if necessary, a curing accelerator for epoxy resin may be added. As the curing accelerator, there can be used various curing accelerators which are generally used, and they include, for example, tertiary amines such as tributylamine, benzyldimethylamine, 2,4,6-tris (dimethylaminomethyl)phenol and the like; imidazoles such as 2-ethyl-4-methylimidazole, N-benzylimidazole and the like; ureas; phosphines; metal salts and the like. These may be used alone or in combination of two or more.

As the epoxy resin curing agent (b), the component (D) is preferably used.

The high temperature-curable imidazole compounds (D) has a melting point of not less than 130° C., is small in solubility in the epoxy resin and rapidly reacts with the epoxy resin at a high temperature not lower than about 150° C., and is added for curing the epoxy resin. The component (D) includes specifically-2-methylimidazole, 2-phenylimidazole, 2-phenyl-4-methylimidazole, bis(2-ethyl-4-methylimidazole), 2-phenyl-4-methyl-5-hydroxymethylimidazole, 2-phenyl-4,5-dihydroxymethylimidazole, triazine-addition type imidazole and the like. Epoxy adducts of them and microcapsules of them can also be used. These may be used alone or in combination of two or more.

More preferably, the component (E) is used together with the component (D). The low temperature-curable imidazole compound (E) is well soluble in the epoxy resin and reacts with the epoxy resin at a relatively low temperature range of from 60° C. to 120° C. This curing agent is used for allowing the epoxy resin to start the reaction at the initial stage of heating. When the undercoating agent and the insulating adhesive are integrally cured, it becomes important for molding that the curing reaction starts from the undercoating agent side. Specific examples used as the component (E) include imidazole, 2-ethyl-4-methylimidazole, 2-undecylimidazole, 1-cyanoethyl-2-methylimidazole, 1-cyanoethyl-2-phenylimidazole, 1-cyanoethyl-2-ethyl-4-methylimidazole, 1-aminoethyl-2-methylimidazole, 1-(cyanoethylaminoethyl)-2-methylimidazole, 1-cyanoethyl-2-phenyl-4,5-bis(cyanoethoxymethyl) imidazole and the like. Epoxy adducts of them and microcapsules of them can also be used. These may be used alone or in combination of two or more.

In this case, the amount of the epoxy resin curing agent is varied depending upon the kind of the curing agent, and the total amount of the component (D) and the component (E) is 1 to 10 parts by weight per 100 parts by weight of the epoxy resin, and the proportion of the component (E) is appropriately determined depending upon the desired reaction starting temperature of the undercoating agent.

The photopolymerizable monomer (c) serves as a diluent for the epoxy resin, and a photopolymerizable monomer having a heat-sensitive functional group is preferably used as a part of the component (c). As the component (c), there can be used acrylate and methacrylate compounds having at least one hydroxyl group in one molecule such as hydroxyethyl acrylate, hydroxyethyl methacrylate, hydroxypropyl acrylate, hydroxypropyl methacrylate, hydroxybutyl acrylate, hydroxybutyl methacrylate, butanediol monoacrylate, glycerol methacrylate, phenoxyhydroxypropyl acrylate, polyethylene glycol acrylate, polyethylene glycol methacrylate, glycerol dimethacrylate and the like and, in addition, acrylate and methacrylate compounds having at least one glycidyl group in one molecule such as glycidyl acrylate, glycidyl methacrylate and the like. A light-sensitive polyfunctional monomer having a diluent effect can also be used.

The photopolymerizable monomer (c) is preferably the component (F) which is glycidyl acrylate or glycidyl methacrylate having a heat-sensitive functional group and an excellent heat-curability or the component (G) which is hydroxyethyl acrylate, hydroxyethyl methacrylate or triethylene glycol dimethacrylate. These components serve as a solvent for the epoxy resin and are used for obtaining the so-called solventless type undercoating agent.

The components (F) and (G) react upon irradiation with a light and the polymerization thereof makes the undercoat layer tack-free. When the component (F) is heated, the glycidyl group thereof reacts with the curing agent whereby the component (F) is cured together with the epoxy resin, so that the heat resistance of the undercoating agent is increased and the generation of voids is inhibited. The proportion of each of these components blended is appropriately determined in the range of from 20% to 80% by weight based on the total weight of the two. The total amount of the components (F) and (G) is preferably 20 to 100 parts by weight, more preferably 30 to 70 parts by weight, per 100 parts by weight of a total of the epoxy resins.

The photopolymerization initiator (d) includes benzophenones such as benzophenone, benzoylbenzoic acid, 4-phenylbenzophenone, hydroxybenzophenone and the like; benzoin; benzoin alkyl ethers such as benzoin ethyl ether, benzoin isopropyl ether, benzoin butyl ether, benzoin isobutyl ether and the like; acetophenones such as 4-phenoxydichloroacetophenone, 4-t-butyl-dichloroacetophenone, 4-t-butyl-trichloroacetophenone, diethoxyacetophenone, 2,2-dimethoxy-2-phenylacetophenone and the like; thioxanthones such as thioxanthone, 2-chlorothioxanthone, 2-methylthioxanthone, 2,4-dimethylthioxanthone and the like; alkylanthraquinones such as ethylanthraquinone, butylanthraquinone and the like; etc. These may be used alone or in admixture of two or more. The amount of the photopolymerization initiator (d) added is preferably 0.1 to 10 parts by weight per 100 parts by weight of the photopolymerizable and heat-reactable monomer.

In addition, the undercoating agent for a multilayer printed circuit board of this invention may, if necessary for storage stabilility, have added thereto an ultraviolet inhibitor, a heat-polymerization inhibitor, a plasticizer or the like. Also, for adjusting the viscosity, there can be added an acrylate monomer, a methacrylate monomer, a vinyl monomer or the like. Moreover, there can be incorporated an inorganic filler such as molten silica, crystalline silica, calcium carbonate, aluminum hydroxide, alumina, barium sulfate, mica, talc, clay, white carbon, E glass powder or the like, and there can be added an epoxysilane coupling agent for improving the adhesiveness to the copper foil and internal layer circuit board and the moisture resistance, a defoaming agent for preventing voids or a liquid or powdery flame retardant, or the like.

The light and heat-curable undercoating agent for a multilayer printed circuit board of this invention is a substantially solventless system but can fill the concaves between circuits in an internal layer circuit board to smoothen the internal layer circuit surface. Moreover, the undercoating agent is easily solidified upon irradiation with a light to be made tack-free.

The component (c) in the formulated undercoating agent of this invention acts first of all as a solvent to dissolve the component (a) and other components to convert the undercoating agent to a varnish. Accordingly, the undercoating agent fills the concaves between copper foil circuits in an internal layer circuit board to smoothen the internal layer circuit surface. The component (C) acting as a solvent is polymerized on irradiation with a light to become solid and accordingly loose its action and hence deposit the component (a). Then, the polymerized component (c) and other components are dispersed in the solid component (a). Accordingly, the undercoating agent of this invention is made tack-free upon irradiation with a light, when the component (a) is selected so that the component (a) alone is in an appropriate tack-free state at ordinary temperature. Such a mechanism of making the undercoating agent tack-free is the most characteristic feature of this invention.

Furthermore, the component (c) polymerized by irradiation with a light has a heat-reactive functional group too, and hence is reacted with the curing agent to be cured similarly to the main component epoxy resin during the subsequent heating. Therefore, the cured undercoating agent is excellent in heat resistance, chemical resistance and the like.

By co-using, as the photopolymerizable monomer, a compound having at least one acryloyl or methacryloyl group and at least one glycidyl group in one molecule and a compound having at least one acryloyl or methacryloyl group and at least one hydroxyl group in one molecule in the above-mentioned manner, the undercoating agent is well made tack-free upon irradiation with a light and the integral curing after the lamination to a copper foil provided with an insulating adhesive is well conducted, whereby a multilayer printed circuit board which is free from voids and excellent in surface smoothness and has good characteristics can be prepared.

The outline of a process for producing a multilayer printed circuit board using the undercoating agent of this invention is explained below referring to FIG. 1(A) to FIG. 1(C).

FIG. 1(A):

A liquid undercoating agent (3) is coated on an internal circuit board (1) by a screen printing or using a conventional coating means such as a roller coater, a curtain coater or the like in such a thickness that one surface of the internal layer circuit board (1) is completely covered with the undercoating agent (3). When the degree of filling is insufficient, it follows that air is caught up during the subsequent lamination. Thereafter, the undercoating agent is made tack-free by irradiation with a light. Subsequently, the other surface of the internal layer circuit board (1) is coated with an undercoating agent (3) in the same manner [this step is omitted in FIG. 1(A)].

FIG. 1(B):

A copper foil (5) provided with a thermosetting insulating adhesive (4) is laminated to the surface of the tack-free undercoat layer coated on the internal layer circuit board. As the laminator, for example, a pair of rigid rolls (6) covered with a silicone rubber are used for achieving surface smoothness and the copper foils with insulating adhesive are laminated to both surfaces of the internal layer circuit board (1). The laminating conditions are varied depending upon the pattern of the internal layer circuit; however, the lamination is usually conducted at a pressure of about 0.5 to 6 kgf/cm$^2$ at a surface temperature of from room temperature to about 100° C. at a laminating speed of about 0.1 to 6 m/min. Under such conditions, the photopolymerized undercoating agent can achieve the surface smoothness by use of the rigid roll (6). In this case, the thickness of a layer between the internal layer circuit (2) and the copper foil (5) can be achieved by the thickness of the insulating adhesive (4).

FIG. 1(C):

Subsequently, the undercoating agent (3) and the thermosetting insulating adhesive (4) coated on the copper foil are simultaneously integrally cured by heating to prepare a multilayer printed circuit board.

The insulating adhesive coated on the copper foil may be any thermosetting type insulating adhesive such as an epoxy resin as far as it bonds firmly both the copper foil and the undercoating agent.

The undercoating agent for a multilayer printed circuit board of this invention is coated on an internal layer circuit board and irradiated with a light to be made tack-free, and thereafter, a copper foil provided with a thermosetting type insulating adhesive is laminated thereto by a roll or the like, after which the resulting assembly is heated to cure the undercoating agent and the adhesive, whereby the undercoating agent is fluidized to smoothen the surface. Subsequently, the undercoating agent and the thermosetting type insulating adhesive coated on the copper foil are united, whereby the board thickness is controlled without depending upon the percentage of the remaining internal layer circuit, and a multilayer printed circuit board excellent in board thickness precision can be prepared.

Moreover, when as a photopolymerizable monomer, a compound having at least one acryloyl or methacryloyl group and at least one glycidyl group in one molecule is used alone or in combination with a compound having at least one acryloyl or methacryloyl group and at least one hydroxyl group in one molecule, the undercoating agent is well made tack-free by irradiation with a light and after the lamination of a copper foil provided with the thermosetting type insulating adhesive, the undercoating agent and the adhesive are well integrally cured by heating, thereby easily preparing a multilayer printed circuit board.

DESCRIPTION OF THE PREFERRED EMBODIMENTS

Examples are shown below to explain this invention in more detail. However, the Examples are merely by way of illustration and not by way of limitation. In the Examples, parts are by weight unless otherwise specified.

EXAMPLE 1

In 170 parts of MEK were dissolved 100 parts of a brominated phenoxy resin (bromination degree: 25%, weight average molecular weight: 30,000) and 70 parts by weight of a bisphenol F type epoxy resin (epoxy equivalent: 175, molecular weight: 380) with stirring, and thereto was added 4 parts of 2-phenyl-4-methylimidazole as a curing agent to prepare an insulating adhesive varnish. This varnish was coated on the roughened surface of a copper foil having a thickness of 18 μm so that the thickness after drying became 40 μm, by means of a roller coater, and dried to prepare an insulating adhesive-coated copper foil.

Separately, 100 parts of a brominated cresol novolak epoxy resin (bromination degree: 35%, epoxy equivalent: 280, weight average molecular weight: 1,400), 100 parts of a bisphenol A type epoxy resin (epoxy equivalent: 950, weight average molecular weight: 1,600) and 40 parts of a bisphenol F type epoxy resin (epoxy equivalent: 175, molecular weight: 380) were dissolved in 50 parts of glycidyl methacrylate and 70 parts of hydroxyethyl methacrylate, and to the solution were added 4 parts of 2-phenyl-4-methylimidazole and 8 parts of 1-cyanoethyl-2-ethyl-4-methylimidazole as curing agents and 10 parts of a photopolymerization initiator (Irgacure 651, a trade name of Ciba Geigy for 2,2-dimethoxy-2-phenylacetophenone), and they were mixed thoroughly in a homomixer to prepare an undercoating agent.

A flame-retardant type, glass epoxy double-side copper-clad laminate having a substrate thickness of 0.2 mm and a copper foil thickness of 35 μm was subjected to pattern processing to obtain an internal layer circuit board. The surface of the copper foil was subjected to black oxide treatment, and then the above-mentioned undercoating agent was coated on one surface of the internal layer circuit board in a thickness of about 25 μm by a screen printing. Subsequently, the resulting internal layer circuit board was irradiated with active energy beams under the condition of about 2 J/cm² using two high pressure mercury vapor lamps of 80 W/cm to make the undercoat layer tack-free. Thereafter, the same undercoat layer was prepared also on the other surface of the internal layer circuit board. Subsequently, the above-mentioned insulating adhesive-coated copper foils were laminated to the undercoat layers under the conditions of a temperature of 100° C., a pressure of 2 kg/cm² and a lamination speed of 0.8 m/min using a twin roll, and then the resulting assembly was heat-cured at 150° C. for 30 minutes to prepare a multilayer printed circuit board.

EXAMPLES 2 TO 6

The same procedure as in Example 1 was repeated, except that as the curing agent for epoxy resin in the undercoating agent, the 2-phenyl-4-methylimidazole was replaced with 2-methylimidazole (Example 2), 2-phenylimidazole (Example 3), bis(2-ethyl-4-methylimidazole (Example 4), 2-phenyl-4-methyl-5-hydroxymethylimidazole (Example 5) or 2-phenyl-4,5-dihydroxymethylimidazole (Example 6), to prepare multilayer printed circuit boards.

EXAMPLE 7

The same procedure as in Example 1 was repeated, except that as the curing agent for epoxy resin in the undercoating agent, 10 parts of 2-phenyl-4-methylimidazole was used alone in place of 4 parts of 2-phenyl-4-methylimidazole and 8 parts of 1-cyanoethyl-2-ethyl-4-methylimidazole, to prepare a multilayer printed circuit board.

EXAMPLE 8

The same procedure as in Example 1 was repeated, except that in the undercoating agent, 120 parts of glycidyl methacrylate was used in place of the glycidyl methacrylate and hydroxyethyl methacrylate, to prepare a multilayer printed circuit board.

EXAMPLE 9

The same procedure as in Example 1 was repeated, except that in the undercoating agent, 120 parts of hydroxyethyl methacrylate was used in place of the glycidyl methacrylate and hydroxyethyl methacrylate, to prepare a multilayer printed circuit board.

COMPARATIVE EXAMPLE 1

In the same manner as in Example 1, except that the undercoating agent was not coated, a multilayer printed circuit board was prepared.

The multilayer printed circuit boards obtained were subjected to the following tests to obtain the characteristics shown in Table 1.

Test Method

Internal layer circuit board test piece: 150 μm pitch between lines, 1.00-mmΦ clearance hole.

1. Surface smoothness: R (max) was measured according to JIS B 0601.

2. Test of solder heat resistance after moistened:
Moisture absorption conditions: Pressure cooker treatment at 125° C. at 2.3 atms for 30 minutes.

Test conditions: the case where n=5 and all test pieces were not blistered when floated on a solder bath at 260° C. for 120 sec. was indicated as "○" and the case where 1–4 test pieces were blistered was indicated as "Δ" and the case where all test pieces were blistered was indicated as "×".

3. Filling property: The outer layer copper foil was peeled off and then the ability to fill the concaves between internal layer circuits was judged visually through an optical microscope. The case where the concaves were filled with the undercoating agent was indicated as "○", and the case where the concaves were not filled with the undercoating agent and voids were present was indicated as "×".

4. Thickness of insulating layer between circuit layers: The multilayer printed circuit board was cut and the cross-section was observed through an optical microscope to determine the thickness of insulating layer between the internal layer circuit and the surface copper foil.

TABLE 1

| | Surface smoothness | Solder heat resistance after moistened | Filling property | thickness of insulating layer between circuit layers |
|---|---|---|---|---|
| Example 1 | 3 μm | ○ | ○ | 60 μm |
| Example 2 | 3 | ○ | ○ | 60 |
| Example 3 | 3 | ○ | ○ | 60 |
| Example 4 | 3 | ○ | ○ | 60 |
| Example 5 | 3 | ○ | ○ | 60 |
| Example 6 | 3 | ○ | ○ | 60 |
| Example 7 | 5 | ○ | ○ | 65 |
| Example 8 | 8 | ○ | ○ | 62 |
| Example 9 | 3 | Δ | ○ | 60 |
| Comp. Ex. 1 | 30 | × | × | 40 |

What is claimed is:
1. An undercoating agent for a multilayer printed circuit board, which comprises:
  (a) a normally solid epoxy resin having a softening point of 45° to 120° C.,
  (b) an epoxy resin curing agent,
  (c) a diluent in which the epoxy resin is dissolved and which consists of a photopolymerizable monomer, and
  (d) a photopolymerization initiator.
2. The undercoating agent for a multilayer printed circuit board according to claim 1, wherein the normally solid epoxy resin having a softening point of 45° to 120° C. (a) is a brominated novolak type epoxy resin having a bromination degree of not less than 20% and a molecular weight of 500 to 4,000.
3. The undercoating agent for a multilayer printed circuit board according to claim 1, wherein the normally solid epoxy resin having a softening point of 45° to 120° C. (a) is a mixture of a brominated novolak type epoxy resin having a bromination degree of not less than 20% and a molecular weight of 500 to 4,000, a bisphenol type epoxy resin having a molecular weight of 500 to 2,000 and a bisphenol type liquid epoxy resin having a molecular weight of not more than 500.
4. The undercoating agent for a multilayer printed circuit board according to claim 1, wherein the epoxy resin curing agent (b) is a high temperature-curable imidazole compound having a melting point of not less than 130° C.
5. The undercoating agent for a multilayer printed circuit board according to claim 1, wherein the epoxy resin curing agent (b) is a mixture of a high temperature-curable imidazole compound having a melting point of not less than 130° C. and a low temperature-curable imidazole compound.

6. The undercoating agent for a multilayer printed circuit board according to claim 1, wherein the photopolymerizable monomer (c) is at least one member selected from the group consisting of glycidyl acrylate, glycidyl methacrylate, hydroxyethyl acrylate, and hydroxyethyl methacrylate.

7. The undercoating agent for a multilayer printed circuit board according to claim 1, which comprises:

(A) a brominated novolak type epoxy resin having a bromination degree of not less than 20% and a molecular weight of 500 to 4,000, (B) a bisphenol type epoxy resin having a molecular weight of 500 to 2,000, (C) a bisphenol type liquid epoxy resin having a molecular weight of not more than 500, (D) a high temperature-curable imidazole compound having a melting point of not less than 130° C., (E) a low temperature-curable imidazole compound, (F) glycidyl acrylate or glycidyl methacrylate, (G) hydroxyethyl acrylate, hydroxyethyl methacrylate or triethylene glycol dimethacrylate, and (d) a photopolymerization initiator.

8. The undercoating agent for a multilayer printed circuit board according to claim 7, wherein the total amount of component (D) and the component (E) is 1 to 10 parts by weight per 100 parts by weight of a total of the component (A), the component (B) and the component (C);

and the total amount of component (F) and the component (G) is 20 to 100 parts by weight per 100 parts by weight of a total of the component (A), the component (B) and the component (C);

the proportion of the component (F) being 20 to 80% by weight and that of component (G) being 80% to 20% by weight based on the total weight of the component (F) and the component (G); and the amount of the photopolymerization initiator (d) is 0.1 to 10 parts by weight per 100 parts by weight of a total of the component (F) and the component (G).

9. The undercoating agent for a multilayer printed circuit board according to claim 8, wherein the total amount of the component (F) and the component (G) is 30 to 70 parts by weight per 100 parts by weight of a total of the component (A), the component (B) and the component (C).

10. The undercoating agent for a multilayer printed circuit board according to claim 7, wherein the photopolymerization initiator (d) is at least one compound selected from the group consisting of benzophenones, benzoin, benzoin alkyl ethers, acetophenones, thioxanthones and alkylanthraquinones.

11. The undercoating agent for a multilayer printed circuit board according to claim 10, wherein the benzophenones include benzophenone, benzoylbenzoic acid, 4-phenylbenzophenone and hydroxybenzophenone; the benzoin alkyl ethers include benzoin ethyl ether, benzoin isopropyl ether, benzoin butyl ether and benzoin isobutyl ether; the acetophenones include 4-phenoxydichloroacetophenone, 4-t-butyldichloroacetophenone, 4-t-butyltrichloroacetophenone, diethoxyacetophenone and 2,2-dimethoxy-2-phenylacetophenone; thioxanthones include thioxanthone, 2-chlorothioxanthone, 2-methylthioxanthone and 2,4-dimethylthioxanthone; and the alkylanthraquinones include ethylanthraquinone and butylanthraquinone.

12. The undercoating agent for a multilayer printed circuit board according to claim 7, wherein the high temperature-curable imidazole (D) is at least one compound selected from the group consisting of 2-methylimidazole, 2-phenylimidazole, 2-phenyl-4-methylimidazole, bis(2-ethyl-4-methylimidazole), 2-phenyl-4-methyl-5-hydroxymethylimidazole, 2-phenyl-4,5-dihydroxymethylimidazole, triazine-addition type imidazole, epoxy adducts of them and microcapsules of them.

13. The undercoating agent for a multilayer printed circuit board according to claim 7, wherein the low temperature-curable imidazole compound (E) is at least one compound selected from the group consisting of imidazole, 2-ethyl-4-methylimidazole, 2-undecylimidazole, 1-cyanoethyl-2-methylimidazole, 1-cyanoethyl-2-phenylimidazole, 1-cyanoethyl-2-ethyl-4-methylimidazole, 1-aminoethyl-2-methylimidazole, 1-(cycanoethylaminoethyl)-2-methylimidazole, 1-cyanoethyl-2-phenyl-4,5-bis(cyanoethoxymethyl)imidazole, epoxy adducts of them and microcapsules of them.

* * * * *